United States Patent
Kageyama et al.

(10) Patent No.: US 8,125,636 B2
(45) Date of Patent: Feb. 28, 2012

(54) PHOTODETECTOR AND SPECTROMETER USING THE SAME

(75) Inventors: Mitsuaki Kageyama, Hamamatsu (JP); Katsumi Shibayama, Hamamatsu (JP); Seiichiro Mizuno, Hamamatsu (JP); Helmut Teichmann, Zurich (CH); Dietmar Hiller, Zurich (CH); Ulrich Starker, Zurich (CH)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 747 days.

(21) Appl. No.: 10/580,841

(22) PCT Filed: Nov. 24, 2004

(86) PCT No.: PCT/JP2004/017411
§ 371 (c)(1),
(2), (4) Date: Jul. 7, 2008

(87) PCT Pub. No.: WO2005/052523
PCT Pub. Date: Jun. 9, 2005

(65) Prior Publication Data
US 2008/0259331 A1    Oct. 23, 2008

(30) Foreign Application Priority Data
Nov. 28, 2003 (JP) .................. P2003-400278

(51) Int. Cl.
*G01J 3/28* (2006.01)
(52) U.S. Cl. ..................................... 356/326
(58) Field of Classification Search .................. 356/326
See application file for complete search history.

(56) References Cited

U.S. PATENT DOCUMENTS

| | | | | |
|---|---|---|---|---|
| 5,542,018 A | * | 7/1996 | Kuhara et al. | 385/92 |
| 2003/0197855 A1 | * | 10/2003 | Jung et al. | 356/73 |

FOREIGN PATENT DOCUMENTS

| | | |
|---|---|---|
| JP | 63-193559 | 8/1988 |
| JP | 01-115170 | 5/1989 |
| JP | 2-10965 | 1/1990 |
| JP | 09-089669 | 4/1997 |
| JP | 10-506187 | 6/1998 |
| JP | 2002-344002 | 11/2002 |
| JP | 2003-139611 | 5/2003 |
| JP | 2004-077433 | 3/2004 |
| JP | 2004-354176 | 12/2004 |
| WO | 96/08702 | 3/1996 |

* cited by examiner

*Primary Examiner* — Tarifur Chowdhury
*Assistant Examiner* — Abdullahi Nur
(74) *Attorney, Agent, or Firm* — Drinker Biddle & Reath LLP (57) ABSTRACT

A photodiode array, having a plurality of photodiodes 12 (n-type channel regions 121), and a light entrance portion 13, formed of an opening that is used to make light to be detected by photodiodes 12 enter, are provided in a substrate 10 of a photodetector 1A having an n-type substrate 101 and a p-type epitaxial layer 102. Furthermore, a carrier capturing portion 60, for capturing carriers generated at a substrate portion near the light entrance portion 13 and removes the captured carriers to the exterior via an electrode 61, is arranged from a layer portion of the epitaxial layer 102 that is positioned between the photodiode array 11 and the light entrance portion 13. A photodetector of a simple arrangement, which, when applied to a spectrometer, enables the positioning precision of components of the spectrometer to be improved, and a spectrometer using this photodetector are thus realized.

6 Claims, 8 Drawing Sheets

PHOTODETECTOR AND SPECTROMETER USING THE SAME

TECHNICAL FIELD

The present invention relates to a photodetector equipped with a photodetecting element array and a spectrometer using the photodetector.

BACKGROUND ART

A spectrometer is an optical device that separates light to be measured into spectral components by means of a dispersive element, such as a prism or a diffraction grating. With such a device, by detecting the spectral components of the light spectrally separated by the dispersive element, a wavelength distribution of the light, an intensity of a specific wavelength component, etc., can be made known. Such a device is thus used in various applications (see, for example, Patent Document 1).

Patent Document 1: Japanese Patent Application Laid-Open No. H09-89669

DISCLOSURE OF THE INVENTION

Problems to be Solved by the Invention

With a dispersion type spectrometer that uses a diffraction grating, etc., a photodiode array, which is disposed at a stage subsequent the diffraction grating and in which a plurality of photodiodes are arrayed, is used as a detecting means that detects the spectral components of the spectrally separated light. By detecting the spectral components of the spectrally separated light by each of the plurality of photodiodes, the wavelength distribution of the light can be measured.

Meanwhile, a slit-like, light entrance member is disposed at a stage before the diffraction grating to restrict an optical path and an incident angle of the light that enters as the object of measurement. The light entrance member, the dispersive element, and the photodiode array are fixed integrally in a mutually positioned state via a housing.

In manufacturing such a spectrometer, the light entrance member, the dispersive element, and the photodiode array must be positioned at high positioning precision to enable spectroscopic measurement of high resolution and high precision. However, with the spectrometer of the above-described arrangement, a step of aligning and fixing the components with respect to each other is complicated, or an adequate positioning precision cannot be obtained in the alignment of the respective components in some cases.

Figure 8:
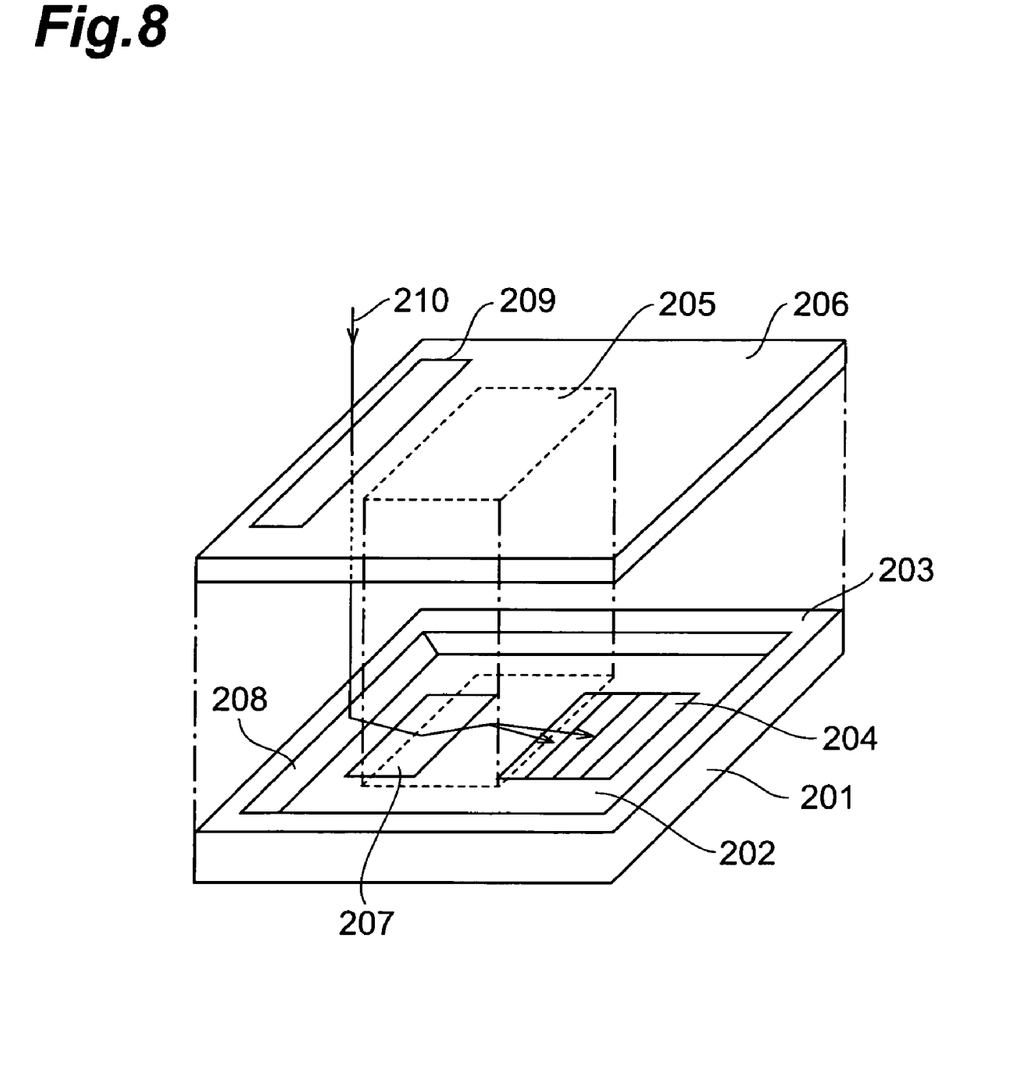
FIG. 8 is a perspective view of an arrangement of a conventional spectrometer.

As an example of an arrangement of a conventional spectrometer, the arrangement of the spectrometer described in Patent Document 1 is shown in FIG. 8. With this spectrometer, a surface of a semiconductor substrate 201 that serves as a frame is etched to form a depressed portion bottom surface 202, on which patterns of a photodiode array 204 and a reflecting surface 207 are formed. A reflecting surface is also formed on an inclined side surface 208 of the depressed portion. A plate-like protective member 206 is positioned on top of the substrate 201, and a light transmitting region 209 and a diffraction grating 205 are formed on this protective member 206. With this spectrometer, the protective member 206 is positioned and adhered onto an upper surface 203 of the substrate 201 to form the spectrometer.

With this spectrometer, light that is made to enter from light transmitting region 209 reaches the diffraction grating 205 via the reflecting surface of side surface 208 and the reflecting surface 207 of the bottom surface 202 as indicated by an optical path 210 in FIG. 8. Light that is spectrally separated by the diffraction grating 205 is then detected by the photodiode array 204.

With the spectrometer shown in FIG. 8, by the positioning of the semiconductor substrate 201 and the protective member 206, the light illuminating region 209 and the diffraction grating 205 are positioned with respect to the photodiode array 204. However, since the photodiode array 204 and the reflecting surface 207 are formed upon forming the depressed portion in the substrate 201, the spectrometer is made complicated in terms of structure and manufacturing process. Also, the photodiode array 204 and the reflecting surface 207, disposed on the substrate 201, and the light illuminating region 209 and the diffraction grating 205, disposed on the protective member 206, must be positioned with respect to each other and the alignment of these components is difficult.

The present invention has been made to resolve the above-described problems, and an object thereof is to provide a photodetector of a simple arrangement, which, when applied to a spectrometer, enables the positioning precision of components of the spectrometer to be improved, and to provide a spectrometer using this photodetector.

Means for Solving the Problems

In order to achieve the above object, a photodetector according to the present invention includes: (1) a substrate; (2) a photodetecting element array, having a plurality of photodetecting elements formed in a predetermined array on the substrate; (3) a light entrance portion, being used to make light, to be detected by the photodetecting elements, enter and including an opening formed in the substrate in a predetermined positional relationship with respect to the photodetecting element array; and (4) a carrier capturing portion, being disposed between the photodetecting element array and the light entrance portion, capturing carriers generated when light is illuminated onto a substrate portion near the light entrance portion, and removing the carriers to the exterior.

With the above-described photodetector, by the photodetecting element array, which is used to detect spectral components of spectrally separated light when applied to a spectrometer, and the opening of the light entrance portion, which makes the light to be measured enter, being disposed on the same substrate, the photodetecting element array and the light entrance portion that are to be components of the spectrometer can be positioned and formed with high precision in advance. A photodetector that enables the positioning precision of components to be improved by a simple arrangement is thus realized. Also, the degree of freedom concerning the arrangement of the photodetecting element array and the light entrance portion is made high.

Furthermore, with the arrangement in which the light entrance portion is disposed on the same substrate as the photodetecting element array as described above, a portion of the entering light may be illuminated directly onto the substrate near the light entrance portion to give rise to extraneous carriers. In regard to this point, the carrier capturing portion is disposed between the photodetecting element array and the light entrance portion in the present photodetector. Thus, even if a portion of the entering light is illuminated onto the substrate near the light entrance portion, detection of light by the photodetecting elements can be performed satisfactorily. This photodetector can be arranged either as a front-illuminated type or as a back-illuminated type.

In regard to a specific arrangement of the photodetector, preferably, the substrate has a first conductive type substrate and a second conductive type epitaxial layer, formed on the first conductive type substrate, and has channel regions, functioning as the photodetecting elements, formed in the epitaxial layer, and the carrier capturing portion is arranged from a layer portion of the second conductive type epitaxial layer that is located between the photodetecting element array and the light entrance portion.

Alternatively, preferably, the substrate has a first conductive type substrate and a second conductive type well region, formed in the first conductive type substrate, and has channel regions, functioning as the photodetecting elements, formed in the well region, and the carrier capturing portion is arranged from a region portion of the second conductive type well region that is located between the photodetecting element array and the light entrance portion.

Alternatively, preferably, the substrate has a first conductive type substrate, has channel regions, functioning as the photodetecting elements, formed in the first conductive type substrate, and has a dummy channel region in a substrate portion of the first conductive type substrate that is located between the photodetecting element array and the light entrance portion, and the carrier capturing portion is arranged from the dummy channel region.

Also, with this arrangement, an electrode for removing the captured carriers to the exterior is preferably connected to the carrier capturing portion.

A spectrometer according to the present invention includes: (1) the above-described photodetector; and (2) a spectroscopic optical system, including a dispersive element that is positioned with respect to the photodetector at a predetermined position along an optical path from the light entrance portion to the photodetecting element array; and wherein (3) light entering from the light entrance portion is spectrally separated by the dispersive element and the spectral components obtained are detected by each of the plurality of photodetecting elements of the photodetecting element array.

With the above-described spectrometer, by the use of the photodetector of the above-described arrangement, in which the photodetecting element array and the light entrance portion are disposed on the same substrate, a spectrometer of a simple arrangement, with which the above-mentioned components are positioned at high precision, can be obtained. Also, because a step of aligning and fixing the photodetecting element array and the light entrance portion with respect to each other is made unnecessary, the manufacture of the spectrometer is made easy. Also, with this spectrometer, the carrier capturing portion is disposed between the photodetecting element array and the light entrance portion in the photodetector. Thus, even if a portion of the entering light is illuminated directly onto the substrate near the light entrance portion, the spectral components of the spectrally separated light can be detected satisfactorily by the photodetecting elements.

Effects of the Invention

With the photodetector and the spectrometer using the same according to the present invention, by the arrangement, in which the photodetecting element array and the light entrance portion are disposed on the same substrate and the carrier capturing portion is disposed between the two components, the positioning precision of the components of the spectrometer is improved by a simple arrangement, and spectral components of spectrally separated light can be detected satisfactorily by the photodetecting elements.

DESCRIPTION OF THE SYMBOLS 1A, 1B—photodetector, 10—semiconductor substrate, 11—photodiode array, 12—photodiode, 13—light entrance portion (opening), 14, 15—detector side positioning portion, 18—electronic circuit portion, 19—electrode pad, 60, 70, 80—carrier capturing portion, 101—n-type substrate, 102—p-type epitaxial layer, 103—p-type well region, 104, 105—dummy channel region, 121, 122, 123—channel region, 61-64, 71-74, 81, 83—electrode,
2—main body, 20—plate-like portion, 21, 22—supporting portion, 21a, 22a—main body side positioning portion, 23—lens, 24—reflection type planar diffraction grating.

BEST MODES FOR CARRYING OUT THE INVENTION

Preferred embodiments of a photodetector according to the present invention and a spectrometer using the same shall now be described in detail along with the drawings. In the description of the drawings, elements that are the same shall be provided with the same symbol and overlapping description shall be omitted. Also, the dimensional proportions in the drawings do not necessarily match those of the description.

An arrangement of a photodetector according to the present invention shall first be described.

Figure 1:
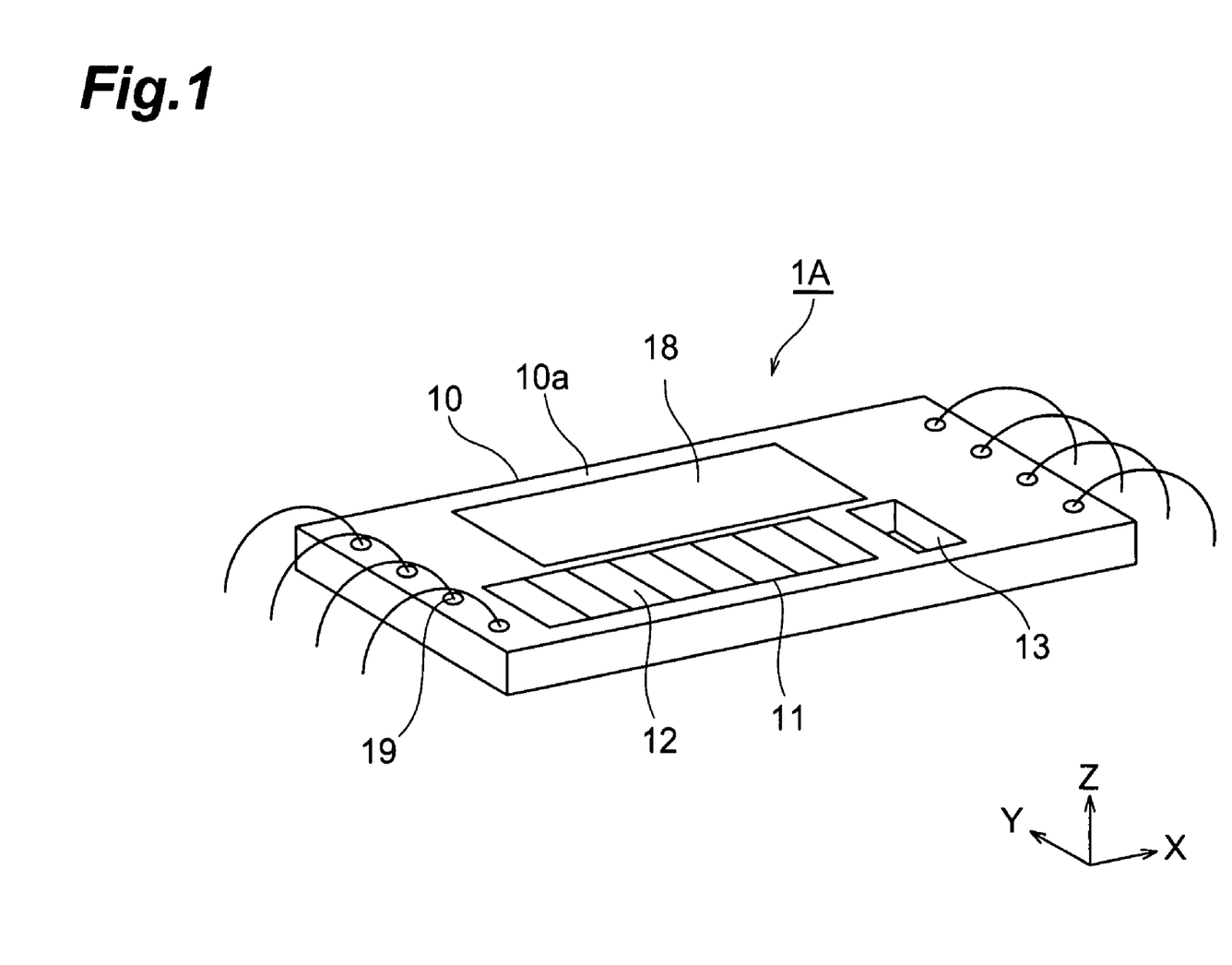
FIG. 1 is a perspective view of an arrangement of an embodiment of a photodetector as viewed from an upper surface side.
Figure 2:
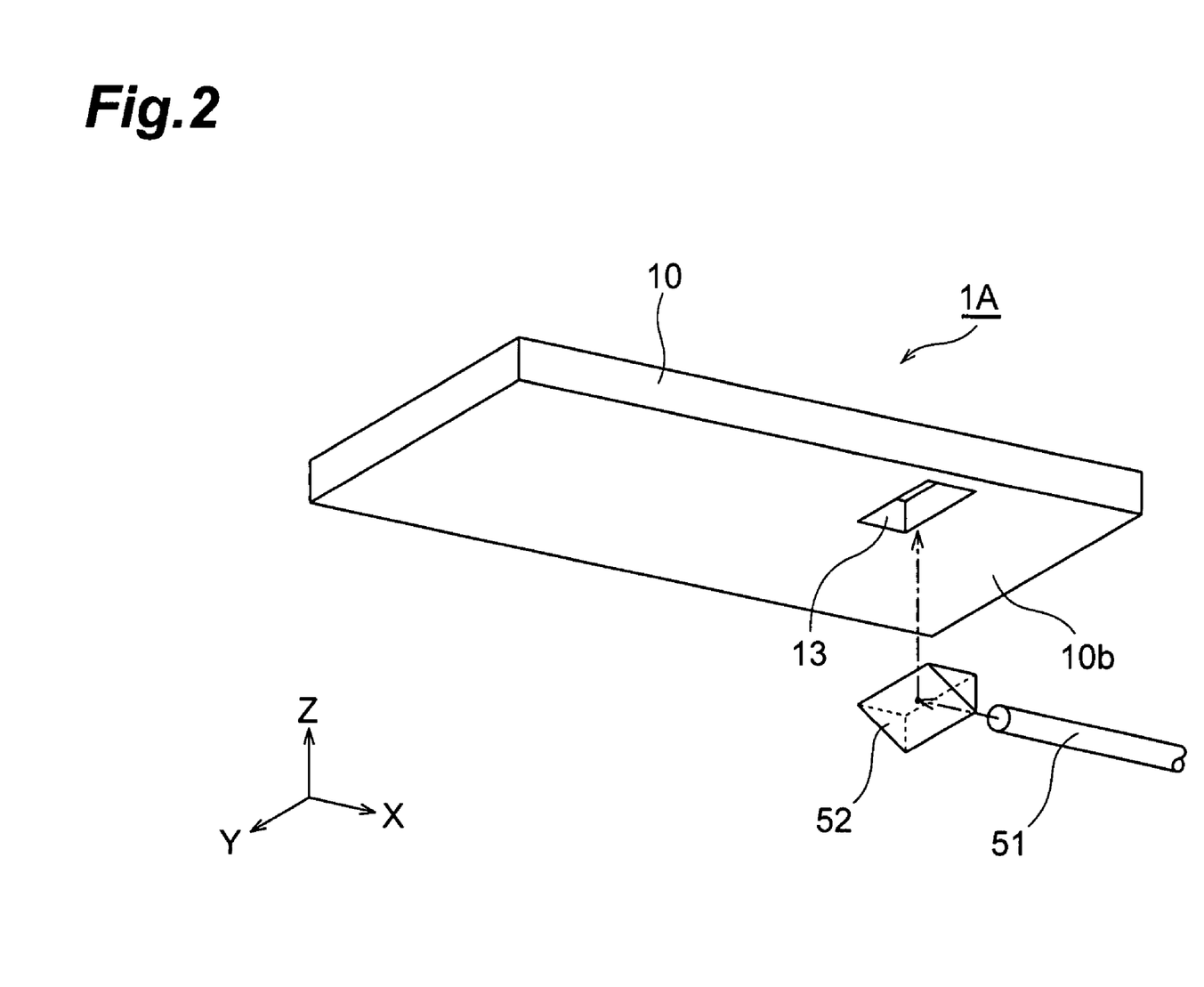
FIG. 2 is a perspective view of the arrangement of the photodetector of FIG. 1 as viewed from a lower surface side.

FIG. 1 is a perspective view of an arrangement of an embodiment of a photodetector according to the present invention as viewed from an upper surface side. FIG. 2 is a perspective view of the arrangement of the photodetector of FIG. 1 as viewed from a lower surface side.

For the convenience of description in the following, as shown in FIG. 1, a z-axis shall be defined as an axis orthogonal to a substrate of the photodetector, and an x-axis and a y-axis shall be defined as two axes that are orthogonal to the z-axis and define the plane of the substrate. Also, if necessary for description, a negative direction and a positive direction along the x-axis shall be defined to be a left direction and a right direction, respectively, a negative direction and a positive direction along the y-axis shall be defined to be a front direction and a rear direction, respectively, and a negative direction and a positive direction along the z-axis shall be defined to be a lower direction and an upper direction, respectively.

The photodetector 1A according to the present embodiment has a substrate 10, formed of silicon (Si) for example, or other semiconductor material. A photodiode array (photodetecting element array) 11, having a plurality of photodiodes (photodetecting elements) 12, is formed in a predetermined array on an upper surface 10a of the substrate 10. As shall be described later, this photodiode array 11 is used to detect spectral components of spectrally separated light when the photodetector 1A is applied to a spectrometer. In FIG. 1, the photodiode array 11 is disposed on a front side and a slightly left side of the upper surface 10a with the x-axis as the direction of alignment of photodiodes 12.

An opening 13, which passes through from the upper surface 10a to a lower surface 10b, is formed in the substrate 10. This opening 13 is used as a light entrance portion for making light to be detected by photodiodes 12 enter when the photodetector 1A is applied to a spectrometer and is positioned in advance in a predetermined positional relationship with respect to the photodiode array 11. In FIG. 1, the light entrance portion 13 is formed as an open shape of the form of a rectangular slit at a predetermined position at a front, right side of the substrate 10 and is adjacent across a predetermined distance to a photodiode 12 at a right end of the photodiode array 11.

An electronic circuit portion 18 is disposed at a rear side of the upper surface 10a. This electronic circuit portion 18 is provided with wirings, circuitry, etc., necessary for applying a bias voltage to the respective photodiodes 12 included in the photodiode array 11 and for signal processing. At left and right end portions of the upper surface 10a are disposed electrode pads 19 that are respectively used for input/output of electrical signals, etc., via bonding wires.

In the photodetector 1A, a carrier capturing portion, for capturing carriers generated when light is illuminated onto a substrate portion near the light entrance portion 13 and for removing the carriers to the exterior, is disposed with respect to the above-mentioned photodiode array 11 and the light entrance portion 13 at a portion between the photodiode array 11 and the light entrance portion 13.

Figure 3:
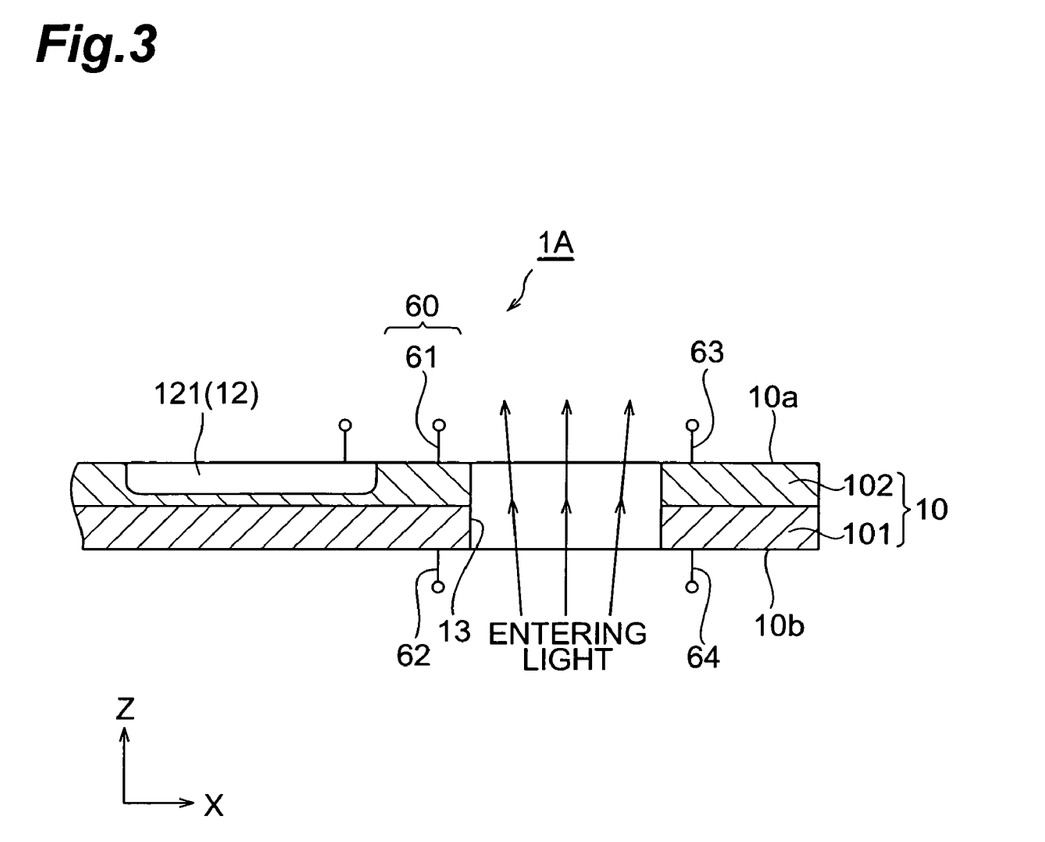
FIG. 3 is a sectional view of an arrangement of a carrier capturing portion in the photodetector of FIG. 1.

FIG. 3 is a sectional view of an arrangement of the carrier capturing portion in the photodetector shown in FIG. 1. In this figure, the structure of a substrate portion that includes a photodiode 12, which, of the photodiode array 11, is positioned at the right end, and the light entrance portion 13 is shown by a section along the x-axis.

The substrate 10 in the present embodiment has an n-type (first conductive type) substrate 101 and a p-type (second conductive type) epitaxial layer 102 formed on the n-type substrate 101. The n-type channel regions 121 that function as photodiodes 12 of the photodiode array 11 (and of which only one is illustrated in the figure) are formed in the predetermined array in the epitaxial layer 102. Also, between the photodiode array 11 and the light entrance portion 13, an electrode 61, connected to the epitaxial layer 102, and an electrode 62, connected to the substrate 101, are disposed at predetermined positions of the upper surface 10a and the lower surface 10b, respectively.

With this arrangement, a carrier capturing portion 60 is arranged from a layer portion of the epitaxial layer 102 that is positioned between the photodiode array 11 and the light entrance portion 13. That is, carriers, generated at a substrate portion near the light entrance portion 13, are captured by the above-mentioned layer portion of the epitaxial layer 102 and do not reach channel regions 121. The captured carriers are removed to the exterior via the electrode 61. Electrodes 63 and 64 are disposed in likewise manner at the side of the light entrance portion 13 opposite the photodiode array 11 side.

Effects of the photodetector 1A according to the present embodiment shall now be described.

With the photodetector 1A, shown in FIG. 1 to FIG. 3, the photodiode array 11 and the opening that is to be the light entrance portion 13 are disposed on the same substrate 10. By this arrangement, when the photodetector 1A is applied to a spectrometer, the photodiode array 11 and the light entrance portion 13 that are to be components of the spectrometer can be positioned and formed with high precision in advance. A photodetector that enables the positioning precision of the components to be improved by a simple arrangement is thus realized.

Also, with this arrangement, the degree of freedom concerning the arrangement of the photodiode array 11 and the light entrance portion 13 is made high in comparison to an arrangement, in which the photodiode array and the light entrance portion are separate members that are aligned and fixed with respect to each other. Such a degree of freedom of arrangement is effective for arranging a spectrometer using a photodetector having a photodiode array.

Here, at the light entrance portion 13, the direction from the lower surface 10b side to the upper surface 10a side of the substrate 10 is the direction of entry of light when the photodetector 1A is applied to a spectrometer. The opening of the light entrance portion 13 is formed, for example, to an opening of rectangular shape, having side surfaces that are perpendicular or inclined at predetermined angles with respect to the upper surface 10a and the lower surface 10b, and restricts the optical path and the incident angle of the light that enters into the spectrometer as the object of measurement.

Furthermore, with the above-described photodetector 1A, the carrier capturing portion 60 is disposed between the photodiode array 11 and the light entrance portion 13 for carriers that are generated at a substrate portion near the light entrance portion 13. Thus, despite the generation of carriers near the light entrance portion 13, light can be detected satisfactorily by photodiodes 12.

That is, when the above-described photodetector 1A is applied to a spectrometer, the intensity of light that is detected as signal light at the photodiode array 11 via a diffraction grating or other dispersive element is weak (for example, approximately 1/1000) in comparison to the light that is made to enter into the spectrometer from the light entrance portion 13. Meanwhile, the light entering from the light entrance portion 13 normally has an angle of spread and a portion thereof may be illuminated directly onto the substrate 10, for example from a side surface of the opening of the light entrance portion 13. If in such as case, the carrier capturing portion 60 is not provided, the carriers generated inside the substrate 10 by the incident light become noise at photodiodes 12 and the spectral components of the spectrally separated light cannot be detected satisfactorily.

On the other hand, by providing the carrier capturing portion 60 as described above, the extraneous carriers generated near the light entrance portion 13 will not reach photodiodes 12. The noise at photodiodes 12 can thus be reduced and light can be detected under satisfactory detection conditions. With such an arrangement, an electrode (electrode 61 in FIG. 3) for removing the captured carriers to the exterior is preferably connected to the carrier capturing portion 60.

Any one of various arrangements may be used to make light enter through the light entrance portion 13. As an example, FIG. 2 shows an arrangement, with which light emitted from an optical fiber 51 is made to enter upon reflection by a prism 52 positioned below the light entrance portion 13. When an optical fiber for light entry is installed at the lower surface 10b side of the substrate 10, a V-groove, etc., for positioning and fixing the optical fiber, is preferably provided on the lower surface 10b.

Furthermore, the photodetector may generally be arranged as a front-illuminated type or as a back-illuminated type. In the case of a back-illuminated type, since light is illuminated from the front surface of the substrate, the photodetecting elements for receiving the illuminated light at the back surface are formed on the back surface of the substrate. Also, in regard to the substrate, a portion or entirety thereof may be thinned. The use of a back-illuminated type photodetector is preferable for the detection of light of short wavelength. The substrate used in the photodetector has a size, for example, of approximately 3.0 mm×10.0 mm, and the opening (slit) that is to be the light entrance portion has a size, for example, of approximately 150 µm×1.5 mm.

In preparing the photodetector 1A of the above-described arrangement, first, the p-type layer 102 is formed by epitaxial growth on the n-type substrate 101, and the n-type channel regions 121, which are to become individual photodiodes 12 of the photodiode array 11, are formed inside the epitaxial layer 102. After then forming the necessary wiring and surface protective film, etc., the opening of the light entrance portion 13 is formed by dry etching or wet etching.

In regard to the arrangement of the carrier capturing portion provided in the photodetector, any one of various arrangements besides the arrangement example shown in FIG. 3 may be employed.

Figure 4:
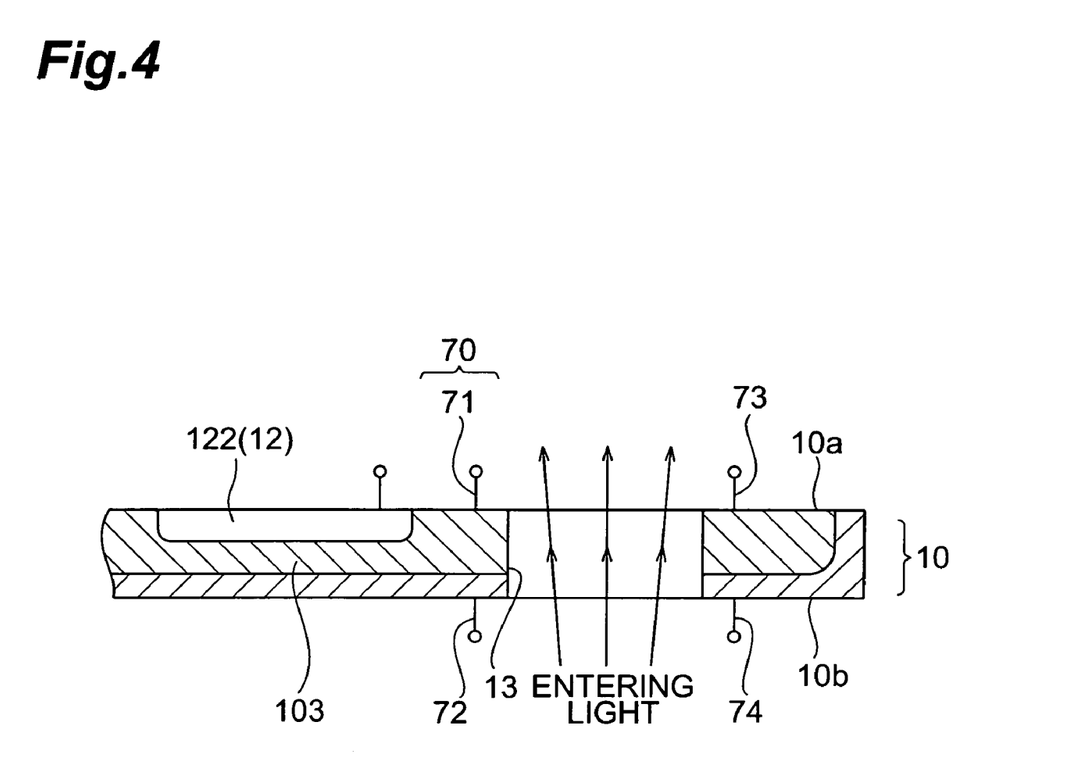
FIG. 4 is a sectional view of another example of an arrangement of a carrier capturing portion in the photodetector of FIG. 1.

FIG. 4 is a sectional view of another example of an arrangement of a carrier capturing portion in the photodetector shown in FIG. 1. The substrate 10 of this arrangement example is formed of an n-type (first conductive type) substrate. In the substrate 10, a p-type (second conductive type) well region 103 is formed. Inside the well region 103, n-type channel regions 122, which function as photodiodes 12 of the photodiode array 11, are formed in a predetermined array (with only one being illustrated in the figure). Between the photodiode array 11 and the light entrance portion 13, an electrode 71, connected to the well region 103, and an electrode 72, connected to the substrate 10, are disposed at predetermined positions on the upper surface 10a and the lower surface 10b, respectively.

With this arrangement, a carrier capturing portion 70 is arranged from a layer portion of the well region 103 that is positioned between the photodiode array 11 and the light entrance portion 13. That is, carriers, generated at a substrate portion near the light entrance portion 13, are captured by the above-mentioned region portion of the well region 103 and do not reach channel regions 122. The captured carriers are removed to the exterior via the electrode 71. Electrodes 73 and 74 are disposed in likewise manner at the side of the light entrance portion 13 opposite the photodiode array 11 side.

Figure 5:
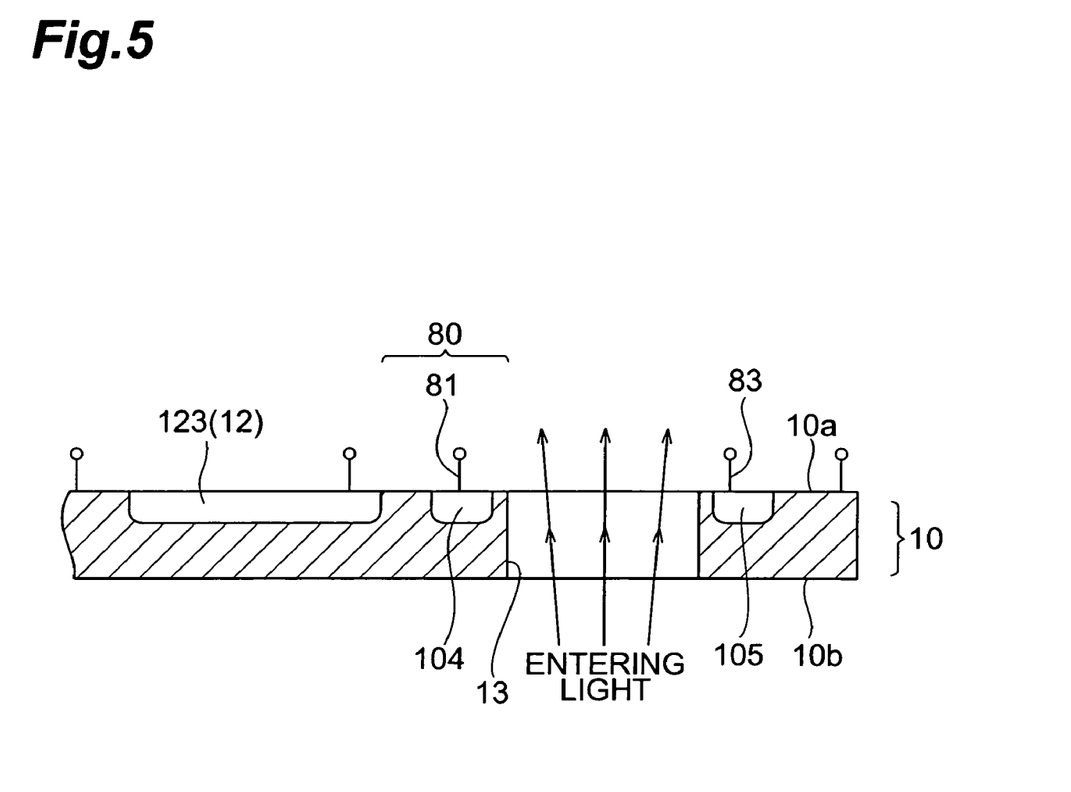
FIG. 5 is a sectional view of another example of an arrangement of a carrier capturing portion in the photodetector of FIG. 1.

FIG. 5 is a sectional view of yet another example of an arrangement of a carrier capturing portion in the photodetector shown in FIG. 1. The substrate 10 of this arrangement example is formed of an n-type (first conductive type) substrate. In the substrate 10, p-type channel regions 123, which function as photodiodes 12 of the photodiode array 11, are formed in a predetermined array (with only one being illustrated in the figure). Furthermore, in a substrate portion of the substrate 10 between the photodiode array 11 and the light entrance portion 13, a p-type dummy channel region 104, which serves as the carrier capturing layer, is formed. Also, between the photodiode array 11 and the light entrance portion 13, an electrode 81, connected to the dummy channel region 104 is disposed at a predetermined position of the upper surface 10a.

With this arrangement, a carrier capturing portion 80 is arranged from the dummy channel region 104. That is, carriers, generated at a substrate portion near the light entrance portion 13, are captured by the dummy channel region 104 for capturing carriers and do not reach channel regions 123. The captured carriers are removed to the exterior via the electrode 81. A dummy channel region 105 and an electrode 83 are disposed in likewise manner at the side of the light entrance portion 13 opposite the photodiode array 11 side.

As shown in FIG. 3 to FIG. 5, any one of various arrangements may be used as the specific arrangement of the carrier capturing portion. In general, it is sufficient that the carrier capturing portion be disposed between the photodetecting element array and the light entrance portion and be arranged to be able to capture carriers generated when light is illuminated onto a substrate portion near the light entrance portion and remove the captured carriers to the exterior.

In a case where a dummy channel region (dummy photodiode) is to be provided for the light entrance portion as shown in FIG. 5, as long as carriers can be captured adequately, the dummy channel region may be of a pattern that surrounds the light entrance portion continuously or may be of a pattern, with which the light entrance portion is surrounded by a plurality of separated dummy channel regions.

An arrangement of a spectrometer according to the present invention shall now be described.

Figure 6:
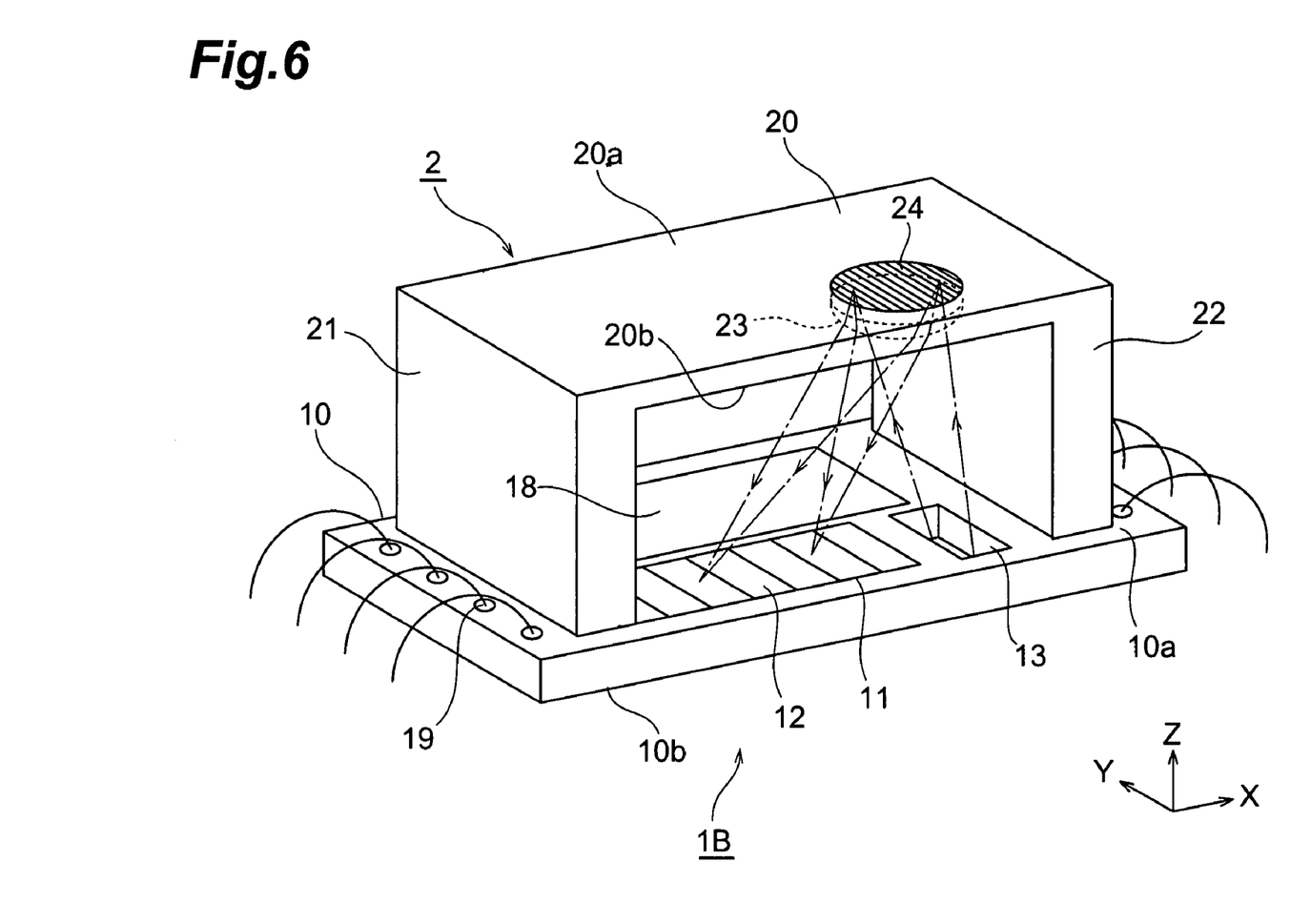
FIG. 6 is a perspective view of an arrangement of an embodiment of a spectrometer.
Figure 7:
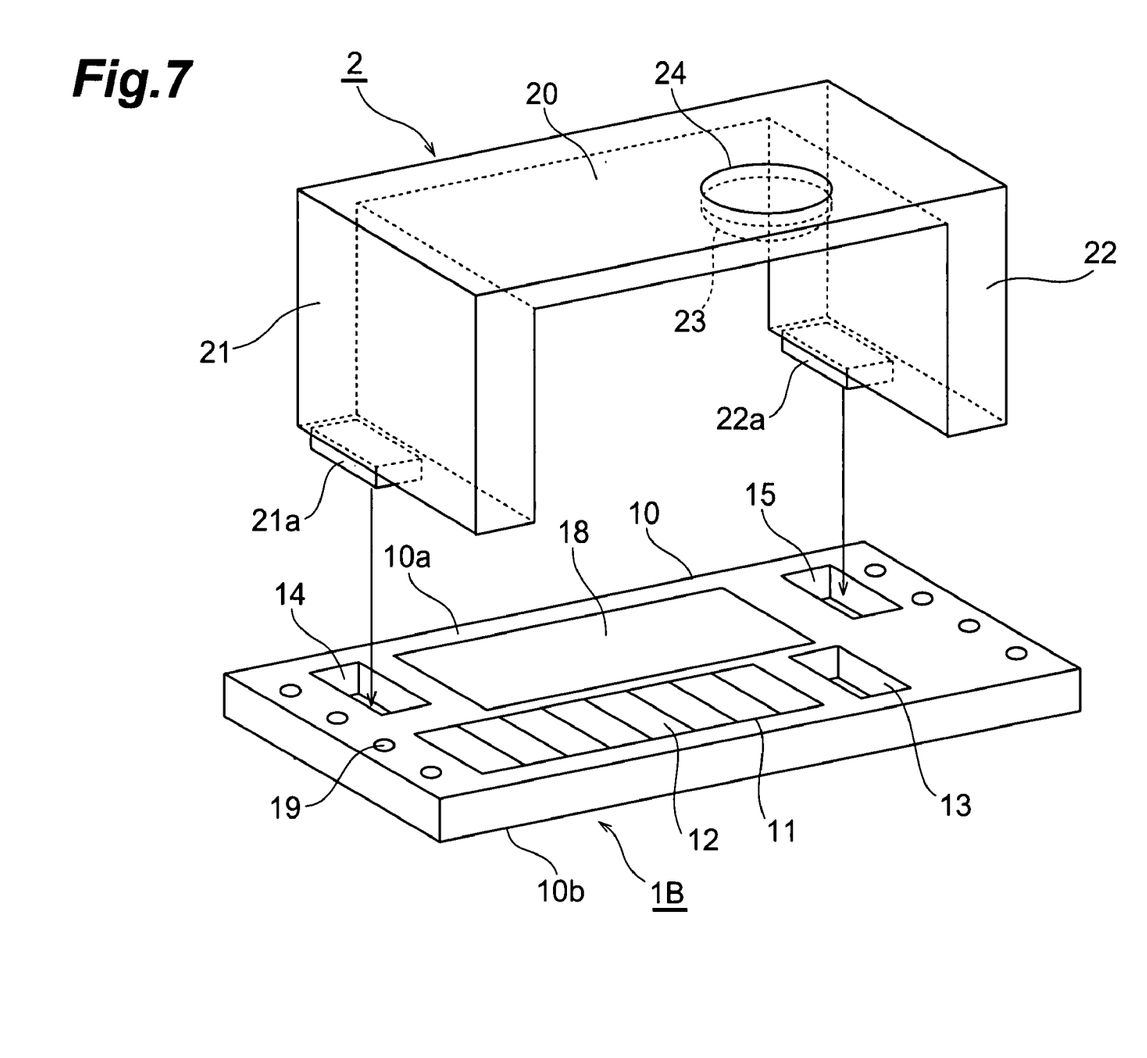
FIG. 7 is an exploded perspective view of the spectrometer shown in FIG. 6.

FIG. 6 is a perspective view of an arrangement of an embodiment of a spectrometer according to the present invention. FIG. 7 is an exploded perspective view of the spectrometer shown in FIG. 6. The spectrometer of the present embodiment has a photodetector 1B and a main body 2. The photodetector 1B is the same in the arrangement of the substrate 10, the photodiode array 11 with the plurality of photodiodes 12, the light entrance portion 13, the electronic circuit portion 18, and the carrier capturing portion 60 as the photodetector 1A shown in FIG. 1 to FIG. 3.

In the photodetector 1B, the substrate 10 has, in addition to the opening 13, which is the light entrance portion, two openings 14 and 15 that respectively pass through from the upper surface 10a to the lower surface 10b formed therein. These openings 14 and 15 are detector side positioning portions used to position and install other members that make up the spectrometer on the upper surface 10a of the substrate 10 and are positioned in advance in a predetermined positional relationship with respect to the photodiode array 11.

As shown in the exploded view of FIG. 7, in the present embodiment, the positioning portion 14 is formed as an opening of rectangular shape at a predetermined position at the rear left side of the substrate 10. The positioning portion 15 is formed likewise as an opening of rectangular shape at a predetermined position at the rear right side of the substrate 10.

With respect to the photodetector 1B, the main body 2 is positioned and installed on the upper surface 10a of the substrate 10. This main body 2 has a plate-like portion 20 that is positioned above the substrate 10 and supporting portions 21 and 22 that support the plate-like portion 20 above the substrate 10. The plate-like portion 20 is formed to a rectangular plate-like shape, and a lower surface 20b thereof is an optical surface that opposes the substrate 10 across a predetermined distance. With this spectrometer, light that is to be measured passes through the interior of the opening of the light entrance portion 13 and is illuminated toward the plate-like portion 20 above.

The supporting portion 21 is disposed between a left end portion of the plate-like portion 20 and the substrate 10. The supporting portion 22 is disposed between a right end portion of the plate-like portion 20 and the substrate 10. The main body 2 is thus made to have a bridge shape formed by the plate-like portion 20 and the supporting portions 21 and 22. Also, the main body 2 is formed integrally by a transparent resin material that transmits light of a predetermined wavelength.

As shown in FIG. 7, a protrusion 21a is disposed at a predetermined position of a lower surface side of the supporting portion 21. A protrusion 22a is disposed likewise at a predetermined position of a lower surface side of the supporting portion 22. These protrusions 21a and 22a are formed at positions and to shapes corresponding, respectively, to the openings of the detector side positioning portions 14 and 15 provided in the upper surface 10a of the substrate 10. The protrusions 21a and 22a are thus arranged as main body side positioning portions that fit with the positioning portions 14 and 15 to position the main body 2 and the photodetector 1B.

A lens 23 is disposed at a predetermined position, along an optical path of the light that enters from the light entrance portion 13, of the lower surface (inner surface) 20b of the plate-like portion 20 that opposes the substrate 10 of the photodetector 1B. The lens 23 is a lens of nearly semispherical shape centered at a predetermined position above or near an upper surface (outer surface) 20a of the plate-like portion 20 and is provided as an integral portion of the plate-like portion 20 by the forming of a curved surface portion of a certain curvature on the lower surface 20b.

Also, at a portion including the center of curvature of the lens 23 on upper surface 20a of the plate-like portion 20 is disposed a planar diffraction grating 24. The diffraction grating 24 is a dispersive element that spectrally separates the light that enters from the light entrance portion 13 and passes through the lens 23. This diffraction grating 24 is a reflection type planar diffraction grating having a circular outer shape corresponding to the lens 23 and is formed so that its light dispersing direction matches the array direction (the x-axis direction) of photodiodes 12 of the photodiode array 11. A reflection type blazed grating, which is reduced in aberration, may be used as the planar diffraction grating.

With the spectrometer of the above-described arrangement, the light to be measured that enters inside the spectrometer from the light entrance portion 13, provided in the substrate 10 of the photodetector 1B, reaches the lower surface 20b of the plate-like portion 20, is made into parallel light by the lens 23, and is thereafter made incident on the reflection type planar diffraction grating 24, which is the dispersive element.

The incident light is reflected by the diffraction grating 24 and at the same time separated into spectral components according to wavelength and emitted toward the upper surface 10a of the substrate 10 via the lens 23. The spectral components of the spectrally separated light are then converged toward and made incident on photodiode array 11 disposed on the upper surface 10a and detected by the corresponding photodiodes 12.

Effects of the spectrometer according to the present embodiment shall now be described.

The spectrometer shown in FIG. 6 and FIG. 7 is arranged using the photodetector 1B of the above-described arrangement wherein the photodiode array 11 and the light entrance portion 13 are disposed on the same substrate 10. A spectrometer, of a simple arrangement with which the spectrometer components of the photodiode array 11 and the light entrance portion 13 are positioned at good precision, can thus be obtained. Also, with this arrangement, a step of aligning and fixing the photodiode array 11 and the light entrance portion 13 with respect to each other in manufacturing the spectrometer is made unnecessary. The process of manufacturing the spectrometer can thus be facilitated.

Also, with the present spectrometer, the carrier capturing portion is disposed between the photodiode array 11 and the light entrance portion 13 in the photodetector 1B (see FIG. 3). Thus, even if a portion of the entering light is directly illuminated onto the substrate near the light entrance portion 13, the extraneous carriers that are generated are captured by the carrier capturing portion, thereby enabling the spectral components of the light spectrally separated by the diffraction grating 24 to be detected satisfactorily by photodiodes 12.

Also, the spectrometer shown in FIG. 6 is arranged by installing the main body 2, provided with the diffraction grating 24, which is the dispersive element, onto the substrate 10 of the photodetector 1B provided with the photodiode array 11 and the light entrance portion 13. With such a spectrometer, the arrangement of the spectrometer can be made compact as a whole by the on-chip structure.

However, the arrangement of the spectrometer may be that in which such a main body 2 is not used. In general, it is sufficient for a spectrometer to be arranged, in addition to the photodetector of the above-described arrangement, with a spectroscopic optical system that includes a dispersive element that is positioned, with respect to the photodetector, at a predetermined position along an optical path from the light entrance portion to the photodetecting element array.

Also, with the present embodiment, the photodetector 1B and the main body 2 are positioned and fixed by the fitting of the openings, which are detector side positioning portions 14 and 15, with the protrusions, which are main body side positioning portions 21a and 22a. With such an arrangement, with which positioning portions are provided in both the photodetector 1B and the main body 2, positioning by passive alignment is enabled in the process of manufacturing the spectrometer, and the manufacture of the spectrometer is facilitated further. Also, because by the photodetector 1B and the main body 2, the respective components of the spectrometer are positioned with good precision three-dimensionally, a chip-size spectrometer, with which complete self-alignment is possible, can be realized.

The photodetector and the spectrometer using the same according to the present invention are not limited to the above-mentioned embodiments, and various modifications are possible. For example, in regard to the dispersive element used in the spectrometer, any one of various dispersive elements besides the above-described reflection type planar diffraction grating may be used. Also, in regard to the positional arrangement, etc., of the photodetecting element array and the light entrance portion on the substrate in the photodetector, any one of various arrangements may be used according to the overall arrangement of the spectrometer and the arrangement of the carrier capturing portion.

INDUSTRIAL APPLICABILITY

The present invention can be used to provide a photodetector of a simple arrangement, which, when applied to a spectrometer, enables the positioning precision of components of the spectrometer to be improved, and to provide a spectrometer using this photodetector.

The invention claimed is:
1. A photodetector comprising: a substrate;
a photodetecting element array, having a plurality of photodetecting elements formed in a predetermined array on the substrate; a light entrance portion being used to make light enter, the light to be detected by the photodetecting elements; and said light entrance portion including an opening formed in the substrate in a predetermined positional relationship with respect to the photodetecting element array; and a carrier capturing portion, being disposed between the photodetecting element array and the light entrance portion, capturing carriers generated when light is illuminated onto a substrate portion near the light entrance portion, and removing the carriers to the exterior, wherein the substrate is formed of semiconductor material, the photodetecting element array is a photodiode array, the photodetecting elements are photodiodes, and the opening passes through from an upper surface of the substrate to a lower surface of the substrate.

2. The photodetector according to claim 1, wherein
the substrate has a first conductive type substrate and a second conductive type epitaxial layer, formed on the first conductive type substrate, and has channel regions, functioning as the photodetecting elements, formed in the epitaxial layer, and
the carrier capturing portion is arranged from a layer portion of the second conductive type epitaxial layer that is located between the photodetecting element array and the light entrance portion.

3. The photodetector according to claim 1, wherein
the substrate has a first conductive type substrate and a second conductive type well region, formed in the first conductive type substrate, and has channel regions, functioning as the photodetecting elements, formed in the well region, and
the carrier capturing portion is arranged from a region portion of the second conductive type well region that is located between the photodetecting element array and the light entrance portion.

4. The photodetector according to claim 1, wherein
the substrate has a first conductive type substrate, has channel regions, functioning as the photodetecting elements, formed in the first conductive type substrate, and has a dummy channel region in a substrate portion of the first conductive type substrate that is located between the photodetecting element array and the light entrance portion, and
the carrier capturing portion is arranged from the dummy channel region.

5. The photodetector according to claim 1, wherein
an electrode for removing the captured carriers to the exterior is connected to the carrier capturing portion.

6. A spectrometer comprising: a photodetector comprising:
a substrate; a photodetecting element array, having a plurality of photodetecting elements formed in a predetermined array on the substrate;
a light entrance portion being used to make light enter, the light to be detected by the photodetecting elements, and said light entrance portion including an opening formed in the substrate in a predetermined positional relationship with respect to the photodetecting element array; and a carrier capturing portion, being disposed between the photodetecting element array and the light entrance portion, capturing carriers generated when light is illuminated onto a substrate portion near the light entrance portion, and removing the carriers to the exterior, wherein the substrate is formed of semiconductor material, the photodetecting element array is a photodiode array, the photodetecting elements are photodiodes, and the opening passes through from an upper surface of the substrate to a lower surface of the substrate the photodetector; and
a spectroscopic optical system, including a dispersive element positioned with respect to the photodetector at a predetermined position along an optical path from the light entrance portion to the photodetecting element array; and wherein light entering from the light entrance portion is spectrally separated by the dispersive element and the spectral components obtained are detected by each of the plurality of photodetecting elements of the photodetecting element array.

* * * * *